United States Patent
Ma et al.

(10) Patent No.: US 9,531,364 B2
(45) Date of Patent: Dec. 27, 2016

(54) TWO-STAGE PHASE MIXER CIRCUIT

(71) Applicant: Micron Technology, Inc., Boise, ID (US)

(72) Inventors: Yantao Ma, Boise, ID (US); Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/661,992

(22) Filed: Mar. 18, 2015

(65) Prior Publication Data
US 2016/0277015 A1    Sep. 22, 2016

(51) Int. Cl.
*H03K 3/017* (2006.01)
*H03K 5/04* (2006.01)
*H03K 7/08* (2006.01)
*H03K 5/156* (2006.01)

(52) U.S. Cl.
CPC .................... *H03K 5/1565* (2013.01)

(58) Field of Classification Search
USPC ........................ 327/175, 355, 334
See application file for complete search history.

(56) References Cited

U.S. PATENT DOCUMENTS

| | | | |
|---|---|---|---|
| 2007/0030753 A1* | 2/2007 | Kwak | G11C 7/1072 365/233.11 |
| 2014/0002173 A1* | 1/2014 | Park | H03K 5/13 327/356 |

* cited by examiner

*Primary Examiner* — Adam Houston
(74) *Attorney, Agent, or Firm* — Dorsey & Whitney LLP (57) ABSTRACT

Apparatuses and methods are directed to preventing duty cycle distortion in an electronic apparatus. The apparatus generally includes a first phase mixer stage configured to interpolate a first and a second input signal to provide a first intermediate signal and further configured to interpolate the second input signal and a third input signal to provide a second intermediate signal, the first phase mixer stage distorting duty cycle in providing the first intermediate signal. The apparatus further includes a second phase mixer stage configured to interpolate the first intermediate signal and the second intermediate signal to provide an output signal and further configured to compensate for duty cycle distortion of the first phase mixer stage.

25 Claims, 7 Drawing Sheets

TWO-STAGE PHASE MIXER CIRCUIT

BACKGROUND

In an integrated circuit chip, such as a dynamic random access memory ("DRAM") chip, a clock signal is used as a reference signal for adjusting operational timing in the circuit. When an external clock signal enters into a circuit, the clock phase of internal clock signals based on the external clock signal may be delayed because of the inherent delay of the components of the circuit. The clock phase may be adjusted to match the phase of the external clock using a delay circuit such as a delay locked loop ("DLL"). However, the use of delay circuits can distort the clock signal, creating a signal with a duty cycle that departs from the ideal 50% duty cycle.

The size of circuit elements continues to decrease with each successive generation of semiconductor memory devices, and the speed of such devices continues to increase. At such increased operating speeds, distortions in the clock signal duty cycle may adversely affect the functioning of the circuit. Traditional DLL's may include a single phase mixer that receives two input signals (e.g., clock signals) offset by some phase difference and provide a single output signal having a phase that is a mix of the phases of the two input signals. This process of combining clock signals to generate a single output signal having a phase based on the two input signals may be referred to as phase mixing or phase interpolating. In order to adjust the delay of the output signal, the phase mixer may receive one or more control signals for weighting the phases of the input signals so that the output signal is a weighted combination of the phases of the input signals. The weighting may be adjusted to provide an output signal having a desired phase. However, conventional phase mixers may cause duty cycle deviation and provide a duty cycle distorted output clock signal. As previously discussed, distortions in the clock signal duty cycle may adversely affect the functioning of the circuit.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention recognize that, as the speed of circuits increases, traditional DLL delay lines implementing a single phase mixer suffer from nonlinear duty cycle deviation that can affect the output duty cycle by nontrivial amounts. In some instances, the duty cycle distortion may adversely affect the data eye window of the device. Because traditional DLL delay lines use single phase mixers having different pull-up and pull-down ratios, the traditional delay line is subject to large duty cycle distortion. Such large distortion may have adverse effects on the operation of the circuit. For example, in double data rate ("DDR") DRAM circuits, the output clock of the DLL is the output data eye in which the first bit is represented by the time between a rising edge and a falling edge, and the second bit is represented by the time between the falling edge and the subsequent rising edge. Therefore, if the duty cycle is skewed when exiting the DLL, the data eye of the first bit or the second bit is adversely affected with respect to the other which can lead to malfunctioning of the overall circuit. Embodiments disclosed herein propose correcting the duty cycle distortion by using a first stage phase mixer and a second stage phase mixer where the second stage phase mixer compensates for any duty cycle distortion caused by the first stage phase mixer. Embodiments of the present invention may further improve in-system jitter performance and the output data eye window.

Embodiments of the present invention will now be discussed with reference to the several drawings.

Figure 1:
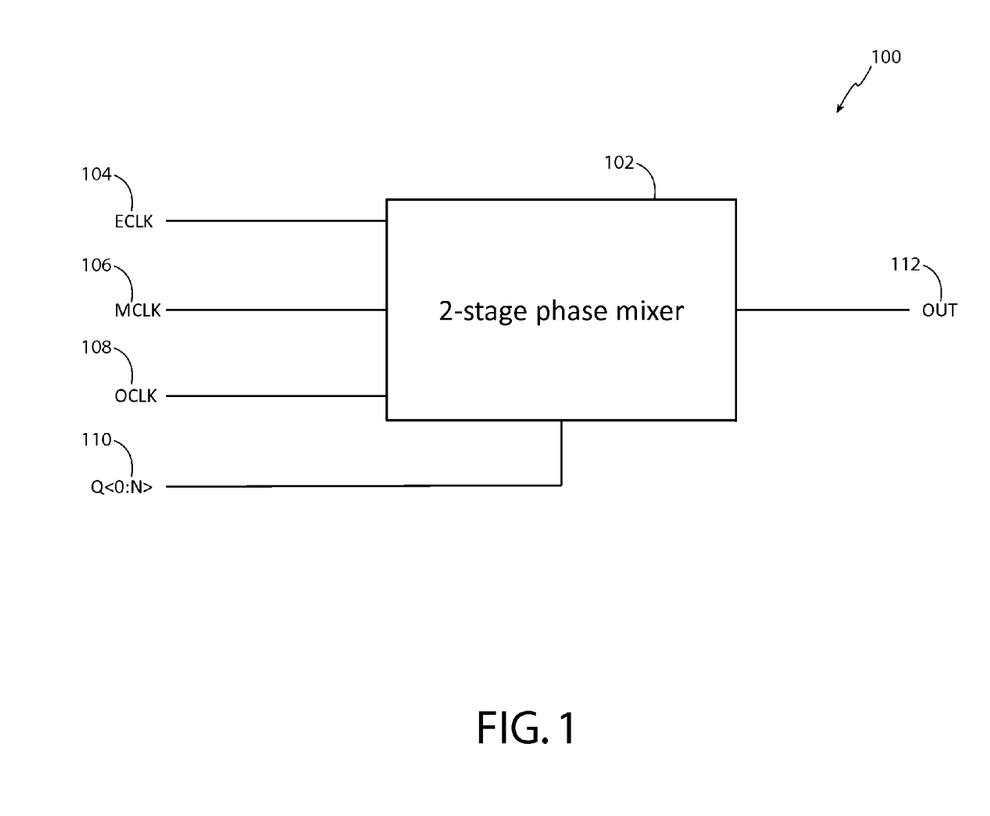
FIG. 1 is a functional block diagram depicting an apparatus including a phase mixer, in accordance with an embodiment of the present invention.

FIG. 1 illustrates an apparatus 100 (e.g., an integrated circuit, a memory device, a memory system, an electronic device or system, a smart phone, a tablet, a computer, a server, etc.) according to an embodiment of the disclosure. The apparatus 100 includes a two-stage phase mixer 102 according to an embodiment of the invention. The two-stage phase mixer 102 is an electronic circuit capable of receiving three input clocks (an even input clock ("ECLK") 104, a mid-phase input clock ("MCLK") 106, an odd input clock ("OCLK") 108, and providing an output clock signal (output clock signal ("OUT") 112) based on a multi-bit control signal (control signal (Q<0:N>) 110). As discussed in further detail below, the two-stage phase mixer 102 may include a plurality of internal phase mixers for interpolating phases between input clocks. In one embodiment, the two-stage phase mixer 102 includes three internal phase mixers which are configured to compensate for duty cycle distortion.

The two-stage phase mixer 102 may receive as inputs three clock signals and one multi-bit control signal. ECLK 104 and OCLK 108 are input clock signals having a phase shift between them. For example, the ECLK 104 and OCLK 108 may be similar clock signals, but with a phase shift between them. In certain embodiments, ECLK 104 and OCLK 108 are provided by a coarse delay line of a DLL and separated by one coarse delay unit (e.g., a two gate delay) which corresponds to a unit delay (i.e., a predetermined phase delay). For example, ECLK 104 may be a clock signal provided to a coarse delay circuit and OCLK 108 may be a clock signal delayed by one coarse delay unit by the coarse delay circuit. As will be appreciated by those skilled in the art, there is no requirement that the phase of ECLK 104 lead the phase of OCLK 108 or vice versa. Either input clock may be the leading clock signal. MCLK 106 is an input clock signal having a phase between the phases of ECLK 104 and OCLK 108. MCLK 106 may be provided using conventional circuits, so long as the phase of MCLK 106 falls between the phases those of ECLK 104 and OCLK 108. In one embodiment, MCLK 106 may be provided by a mid-clock generation circuit. An example of a mid-clock generation circuit according to an embodiment of the invention will be described below with reference to FIG. 4. In various embodiments, ECLK 104, MCLK 106, OCLK 108, and OUT 112 may each be analog or digital signals. Control signal 110 is a multi-bit signal for weighting the input clock signals during phase mixing in providing OUT 112 having a phase relative to the phases of the input clock signals. For example, control signal 110 may indicate that OUT 112 should have the same phase as ECLK 104, OCLK 108, or a phase in between the two depending on the values of the bits in control signal 110. Control signal 110 may be, for example, a fine delay line control signal, a coarse delay line control signal, or any other configurable multi-bit signal. In various embodiments, control signal 110 may be digital or analog. OUT 112 may be used, for example, to clock input/output functions of a DRAM device.

Figure 2:
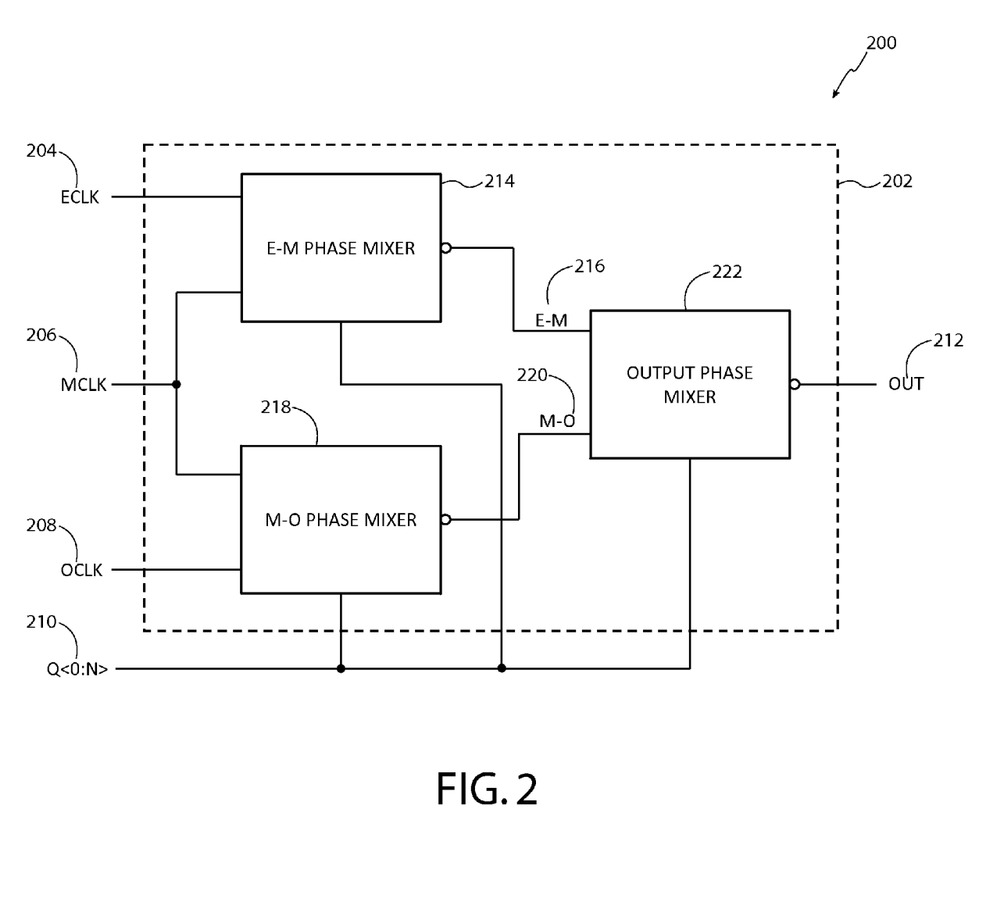
FIG. 2 is a functional block diagram depicting an apparatus including a phase mixer, in accordance with an embodiment of the present invention.

FIG. 2 is a functional block diagram depicting an apparatus, generally designated 200. The apparatus 200 generally includes two-stage phase mixer 202 according to an embodiment of the invention. The two-stage phase mixer 202 is configured to receive ECLK 204, MCLK 206, OCLK 208, control signal 210, and provide OUT 212. In various embodiments, ECLK 204, MCLK 206, OCLK 208, control signal 210, and OUT 212 may be substantially similar in form and generation to ECLK 104, MCLK 106, OCLK 108, control signal 110, and OUT 112, respectively, as described above with respect to FIG. 1. In various embodiments, phase mixer 202, as described in further detail below, may be implemented as phase mixer 102 in FIG. 1.

Phase mixer 202 is a three-clock signal input, two stage phase mixer for generating an output clock cycle. In some embodiments, the phase mixer 202 is configured to provide the output clock signal (i.e., OUT 212) with reduced duty cycle distortion in comparison to conventional phase mixers. Phase mixer 202 may include E-M phase mixer 214, M-O phase mixer 218, and output phase mixer 222. Generally, each of the phase mixers may interpolate, or mix, the phases of the input clock signals in order to generate the output signal having a phase based on the phases of the input signals. The E-M phase mixer 214 and the M-O phase mixer 218 may provide intermediate signals E-M 216 and M-O 220, respectively. The E-M phase mixer 214, M-O phase mixer, and output phase mixer 222 may each be an inverting, two input phase mixer for providing an output signal OUT 212 having a phase that falls between the phases of the two input signals. In various embodiments, E-M phase mixer 214 may receive ECLK 204 and MCLK 206 as input signals and provide E-M signal 216. M-O phase mixer 218 may receive MCLK 206 and OCLK 208 as inputs and provide M-O signal 220. Output phase mixer 222 may receive E-M signal 216 and M-O signal 220 as inputs and provide OUT 212.

Each of E-M phase mixer 214, M-O phase mixer 218, and output phase mixer 222 may receive control signal 210 and apply a weight to the received input signals based on control signal 210. For example, control signal 210 may be a three bit number, such as "0 0 0." With specific reference to E-M phase mixer 214, the E-M phase mixer 214 applies a 100% weight to ECLK 204 and a 0% weight to MCLK 206. In such an example, E-M signal 216 has the same duty cycle information and delayed phase as ECLK 204. Similarly, the "0 0 0" control signal causes the M-O phase mixer 218 to weight MCLK 206 at 100% and provide the M-O signal having identical duty cycle information and delayed phase to MCLK 206. Finally, output phase mixer 222 weights E-M signal 216 at 100% and M-O signal 220 at 0% due to the "0 0 0" control signal. Accordingly, in such an embodiment, OUT 212 has the same duty cycle information and delayed phase as ECLK 204. Alternatively, if control signal 110 has a value of "0 1 1", E-M signal 216 may have a phase that is ⅔ between ECLK 204 and MCLK 206. M-O signal 220 will have a phase that is ⅔ between MCLK 206 and OCLK 208. Output phase mixer 222 also applies a ⅔ weighting factor to each of E-M signal 216 and M-O signal 220 so that OUT 212 has a phase that is equal to (⅓*ECLK 204)+(⅔ *MCLK 206). By increasing the number of bits in control signal 210 (and the number of inverters in the phase mixers, as described below) phase mixer 202 may increase the number of increments by which the phase of OUT 212 may be adjusted.

In various embodiments, E-M phase mixer 214 and M-O phase mixer 218 form the first stage of two-stage phase mixer 202. Output phase mixer 222 may form the second stage of two-stage phase mixer 202. E-M phase mixer 214 and M-O phase mixer 218 provide a first level of phase interpolation using three input signals (i.e., ECLK 204, MCLK 206, and OCLK 208). However the output signals of E-M phase mixer 214 and M-O phase mixer suffer from duty cycle distortion caused by their internal components. In order to correct for the duty cycle distortion, a second stage inverting phase mixer (i.e. output phase mixer 222) provides an equal and opposite phase mixing operation to E-M phase mixer 214 and M-O phase mixer 218. That is, the duty cycle distortion caused by the phase mixing operation of the E-M phase mixer 214 and M-O phase mixer 218 is reversed by the duty cycle distortion caused by the phase mixing operation of the output phase mixer 222. For example, for each and every gate (See FIG. 3) included in E-M phase mixer 214 and M-O phase mixer 218, output phase mixer 222 includes a gate that rectifies the signal and applies an equal and opposite duty cycle distortion so that OUT 212 has a properly interpolated phase without the duty cycle distortion that are symptomatic of traditional, single stage phase mixers.

Figure 3:
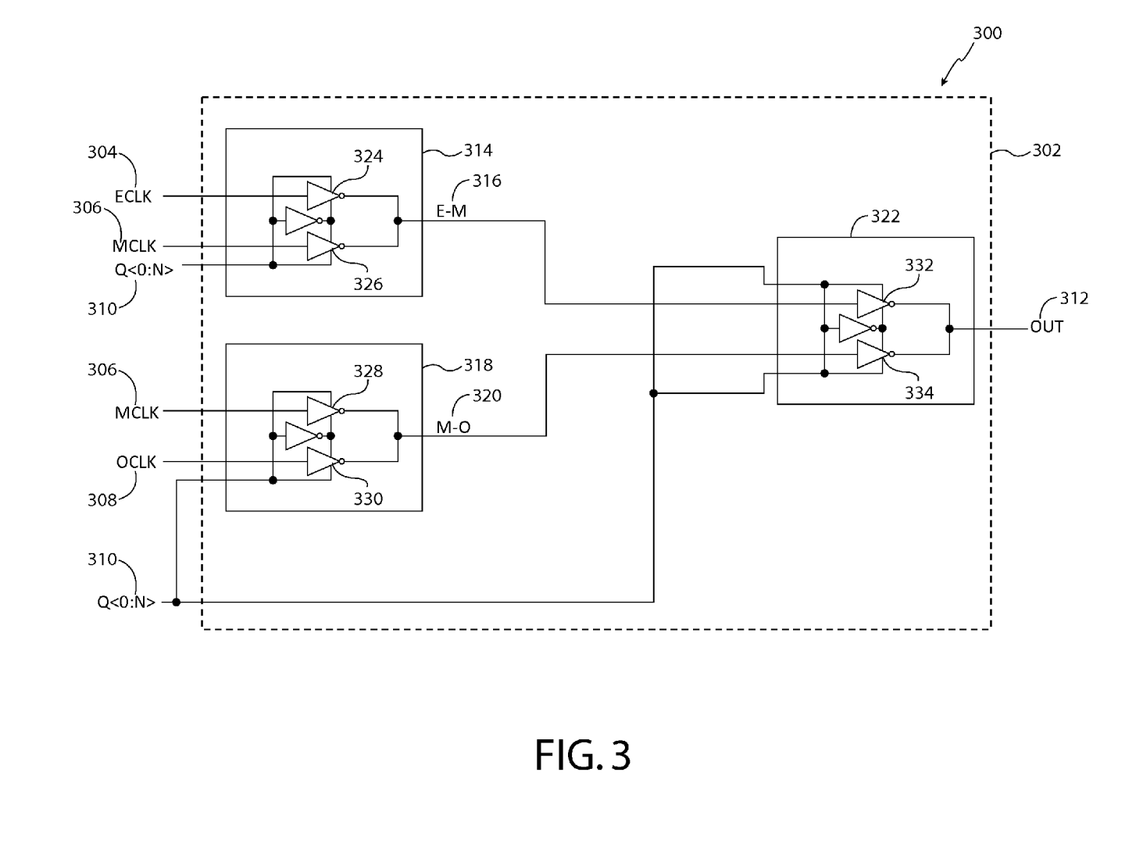
FIG. 3 is a schematic diagram of an apparatus including a phase mixer, in accordance with an embodiment of the present invention.

FIG. 3 is a schematic diagram of an apparatus, generally designated 300. In various embodiments, the apparatus 300 may be implemented as the apparatus 100 in FIG. 1 or as the apparatus 200 in FIG. 2. The apparatus 300 generally includes two-stage phase mixer 302, in accordance with an embodiment of the present invention. The two-stage phase mixer 302 receives as inputs ECLK 304, MCLK 306, OCLK 308, and control signal 310. ECLK 304, MCLK 306, OCLK 308, and control signal 310 may each be implemented as ECLK 104, MCLK 106, OCLK 108, and control signal 110, as discussed above with respect to FIG. 1. The two-stage phase mixer 302 provides a clock signal OUT 312, which may be substantially the same as OUT 112, as discussed above with respect to FIG. 1. The two-stage phase mixer 302 may further include an E-M phase mixer 314, and an M-O phase mixer 318 which provide E-M signal 316 and M-O signal 320, respectively. E-M phase mixer 314 and M-O phase mixer 318 may be implemented as E-M phase mixer 214 and M-O phase mixer 218, as described above with respect to FIG. 2. The two-stage phase mixer 302 may further include an output phase mixer 322 which receives as inputs E-M signal 316 and M-O signal 320. The output phase mixer 322 may be implemented as output phase mixer 222 as discussed above with respect to FIG. 2. Output phase mixer 322 provides the clock signal OUT 312.

E-M phase mixer 314 may include a plurality of inverters 324 and 326, whose outputs may be coupled together in order to provide E-M signal 316. In some embodiments, the inverters 324 are tri-state (High-Z) inverters. E-M phase mixer may include one tri-state inverter 324 for each bit included in control signal 310. Tri-state inverters 324 may receive as inputs the ECLK 304. Tri-state inverters 324 may receive as control inputs a respective bit of the control signal 310. Based on the value of the respective bit of the control signal 310, each of tri-state inverters 324 may output the value of ECLK 304 or not output the value of ECLK 304 as a result of a high impedance state caused by the control signal 310. As one skilled in the art will appreciate, application of the high impedance signal to any of tri-state inverters 324 effectively removes the output of that particular inverter from the circuit. Accordingly, if more tri-state inverters 324 are activated by control signal 310, then more of the ECLK 304 signal is transmitted to the E-M signal 316. Similarly, E-M phase mixer 314 may include one tri-state inverter 326 for each bit in control signal 310. Each tri-state inverter 326 may receive as an input MCLK 306. Each tri-state inverter 326 receives as a control input a respective bit of the inverted control signal 310. By activating more of either tri-state inverters 324 or tri-state inverters 326, E-M signal 316 may be weighted in favor of the phase of either ECLK 304 or MCLK 306. In various embodiments, tri-state inverters 324 and 326 may be similar or identical components with the only difference being the inputs provided to the components.

M-O phase mixer 318 may include tri-state inverters 328 and 330. Tri-state inverters 328 and 330 may be substantially similar to or identical to tri-state inverters 324 and 326. However, tri-state inverters 328 may receive as an input MCLK 306 and tri-state inverters 330 may receive as an input OCLK 308. Tri-state inverters 328 and 330 may be controlled by the same control signal 310 and in the same manner as tri-state inverters 324 and 326. The outputs of tri-state inverters 328 and 330 are coupled together to provide M-O signal 320 having a phase between that of MCLK 306 and OCLK 308.

Output phase mixer 322 is a phase mixer configured to interpolate the phases of E-M signal 316 and M-O signal 320 and provide an output signal OUT 312. The OUT 312 may have a duty cycle that is distorted less than the duty cycle of an output signal provided by a conventional phase interpolator. Output phase mixer 322 includes a plurality of tri-state inverters 332 and 334. In various embodiments, output phase mixer 322 includes one tri-state inverter 332 and one tri-state inverter 334 for each bit in control signal 310. Tri-state inverters 332 may receive E-M signal 316 as a data input and a respective bit of the control signal 310 as a control input. Tri-state inverters 334 may receive M-O signal 320 as a data input and a respective bit of the control signal 310 as a control input. The outputs of tri-state inverters 332 and 334 are coupled together in order to provide OUT 312. As with tri-state inverters 324, 326, 328, and 330, tri-state inverters 332 and 334 may be weighted in accordance with control signals 310.

As discussed above, by pairing an inverter that provides duty cycle distortion with a second, downstream inverter, the inherent duty cycle distortion provided by the first inverter may be compensated for by the downstream inverter. Pairing generally means that for each inverter in the first phase that contributes to the intermediate signals, a second inverter exists in the second phase to compensate for any duty cycle distortion caused by the inverters in the first phase. In the embodiment of FIG. 3, tri-state inverters 332 receives as an input E-M signal 316 from E-M phase mixer 314, which includes tri-state inverters 324 and 326. E-M signal 316 includes duty cycle distortion as a result of tri-state inverters 324 and 326. Tri-state inverter 332 of output phase mixer 322 pairs with tri-state inverters 324 and 326 of E-M phase mixer 314 in order to cancel out the duty cycle distortion of E-M signal 316. Similarly, tri-state inverters 334 receive as an input M-O signal 320 from M-O phase mixer 318, which includes tri-state inverters 328 and 330. Tri-state inverters 334 of output phase mixer 322 pair with tri-state inverters 328 and 330 of M-O phase mixer 318 in order to substantially cancel out the duty cycle distortion of M-O signal 320. Because of the duty cycle distortion compensation effects of tri-state inverters 332 and 334, the outputs of those tri-state inverters may be coupled together to provide the output signal OUT 312 with reduced duty cycle distortion relative to the intermediate signals.

Figure 4:
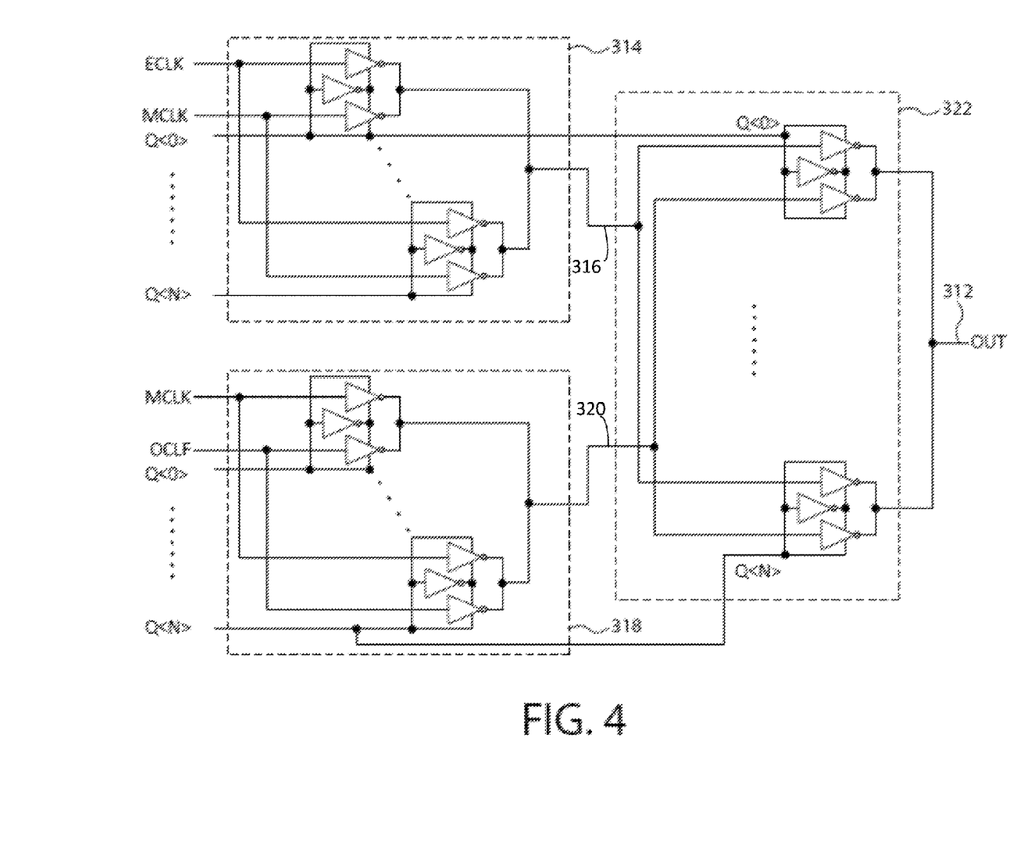
FIG. 4 is a schematic diagram of an apparatus including a phase mixer, in accordance with an embodiment of the present invention.

FIG. 4 is a schematic diagram of an apparatus including a phase mixer, in accordance with an embodiment of the present invention. According to the embodiment of FIG. 4, each of the phase mixers (i.e., E-M phase mixer 314, M-O phase mixer 318, and output phase mixer 322) includes a plurality of phase mixing circuits. Each phase mixing circuit corresponds to one of the bits in control signal Q<0:N>. For example, a first phase mixing circuit may be activated based on a control bit Q<0>, a second phase mixing circuit may be activated based on a second control bit Q<1>, etc. By providing a phase mixing circuit for each of the control bits in control signal 310, the output clock signal of each of the phase mixers 314, 318, and 322 may be weighted by a single input control signal (e.g., control signal 110, 210, or 310).

The apparatus shown in FIG. 4 includes first, second, and third clock nodes providing ECLK 304, MCLK 306, OCLK 308 respectively, the MCLK 306 having a phase that is between a phase of the ECLK 304 and the OCLK 308. The apparatus includes a two-stage phase mixer circuit.

The two-stage phase mixer circuit includes, as a first stage of the two-stage, the first phase mixer 314 including a plurality of first inverters as shown in FIG. 4. Each of the first inverters includes first and second input nodes and a first output node. The first input nodes of the first inverters are coupled in common to the first clock node to receive the ECLK 304, and the second input nodes of the first inverters are coupled in common to the second clock node to receive the MCLK 306, and the first output nodes of the first inverters are coupled in common to each other to provide the E-M signal 316.

The two-stage phase mixer circuit further includes, as a first stage of the two-stage, a second phase mixer 318 including a plurality of second inverters shown in FIG. 4. Each of the second inverters includes fourth and fifth input nodes and a second output node. The fourth input nodes of the second inverters are coupled in common to the second clock node to receive the MCLK 306, and the fifth input nodes of the second inverters are coupled in common to the third clock node to receive the OCLK 308. The second output nodes of the second inverters are coupled in common to each other to provide the M-O signal 320.

The two-stage phase mixer circuit further includes, as a second stage of the two-stage, the third phase mixer 322. The phase mixer 322 includes a plurality of third inverters each having seventh and eighth input nodes as shown in FIG. 4. The seventh input nodes of the third inverters are coupled in common to each other to receive the E-M signal 316, and the eighth input nodes of the third inverters are coupled in common to each other to receive the M-O signal 320. The apparatus shown in FIG. 4 includes a plurality of control nodes each providing the control signals 310. Each of the control signals 310 is provided to corresponding ones of the first, second, and third inverters included respectively in the E-M phase mixer 314, M-O phase mixer 318, and the output phase mixer 322.

Figure 5:
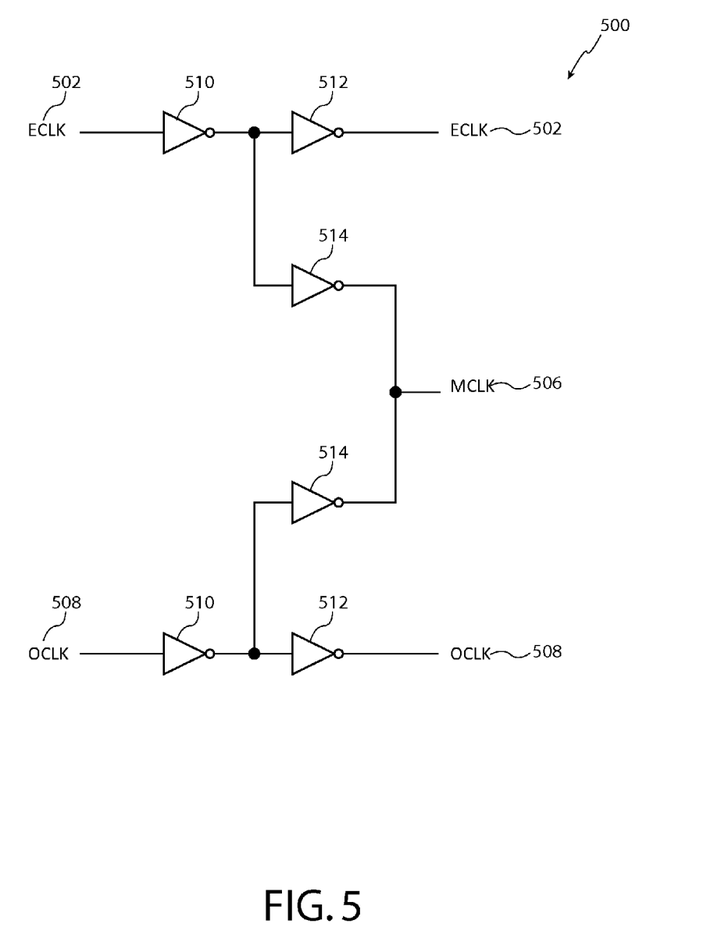
FIG. 5 is a schematic diagram of a mid-clock generation circuit, in accordance with an embodiment of the present invention.

FIG. 5 is a schematic diagram of a mid-clock generation circuit, generally designated 500, in accordance with an embodiment of the present invention. ECLK 502, OCLK 508, and MCLK 506 may be implemented as ECLK 102, OCLK 108, and MCLK 106 as discussed above with respect to FIG. 1. Mid-clock generation circuit 500 receives as inputs ECLK 502 and OCLK 508. Each of the input clock signals passes through an initial inverter 510. The outputs of inverters 510 lead to a second pair of inverters 512. Similarly, OCLK 508 passes through inverters 510 and 512 to output OCLK 508. The outputs of inverters 510 also lead to a second set of inverters 514 in parallel with inverters 512. The outputs of inverters 514 are coupled together to provide MCLK 506. As discussed above, MCLK 506 is a clock signal for input into a two-stage phase mixer and has a phase between those of ECLK 502 and OCLK 508.

Figure 6:
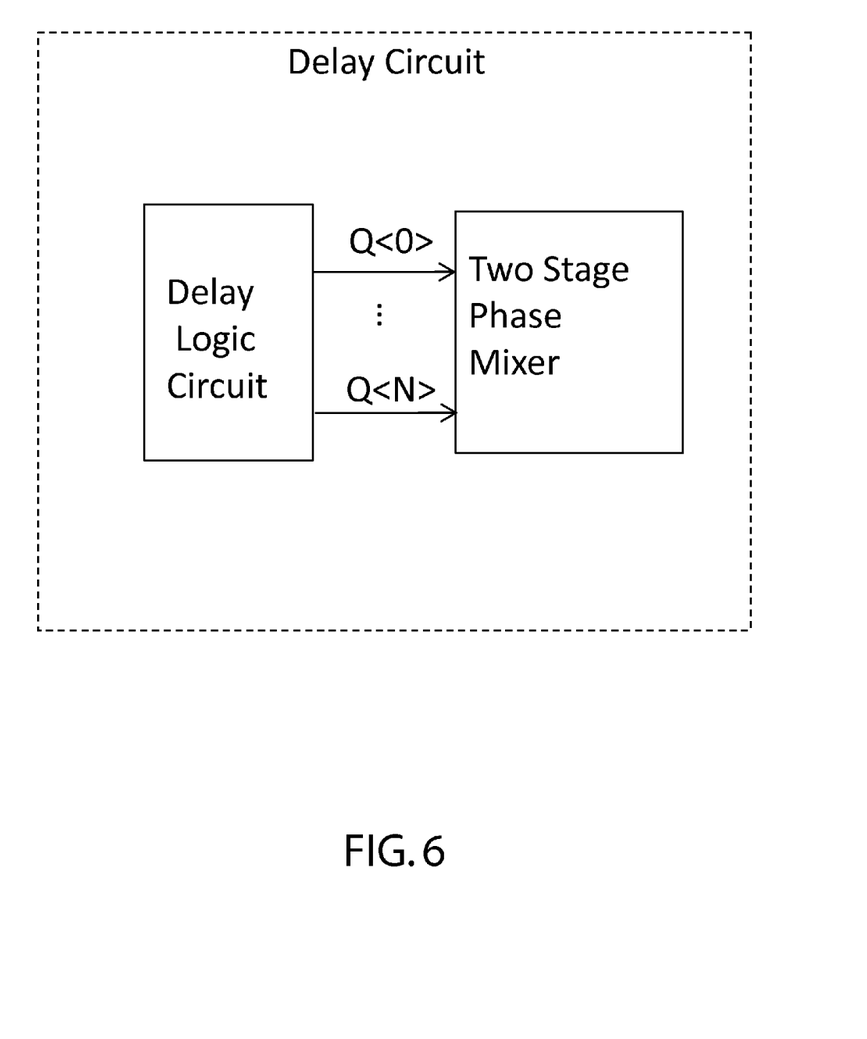
FIG. 6 is a functional block diagram depicting an apparatus including a phase mixer, in accordance with an embodiment of the present invention.

FIG. 6 is a functional block diagram depicting an apparatus including a phase mixer, in accordance with an embodiment of the present invention. FIG. 6 generally includes a delay circuit including a delay logic circuit and a two stage phase mixer. In the embodiment of FIG. 6, the delay logic circuit provides control signals, such as control signals 110, 210, or 310, to a two-stage phase mixer, such as two stage phase mixers 102, 202, or 302. In various embodiments, the control signals generated by the delay logic circuit may be the same as coarse or fine delay line control signals. The same control signals may be used in each stage of the two-stage phase mixer.

Figure 7:
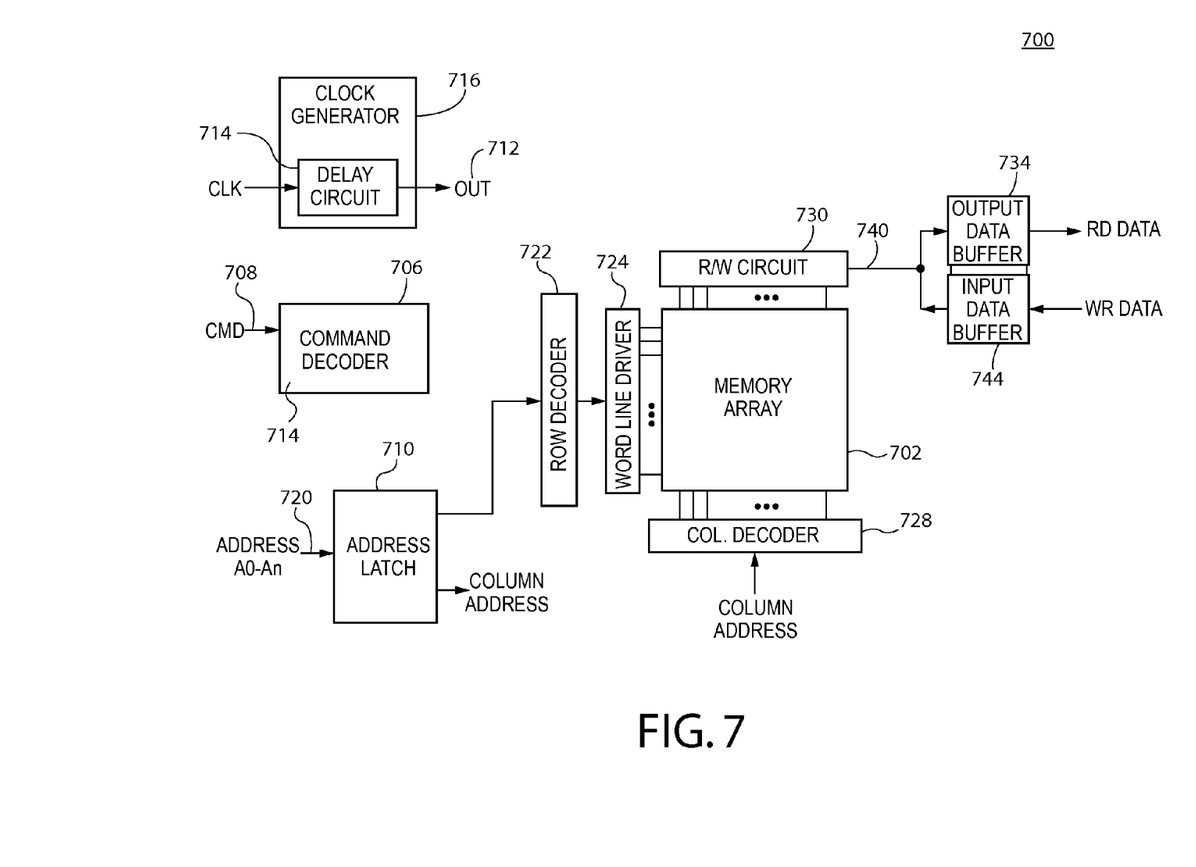
FIG. 7 is a block diagram of a memory including a phase mixer, in accordance with an embodiment of the present invention.

FIG. 7 is a block diagram of a memory 700 including a Delay Locked Loop circuit, according to an embodiment of the invention. The memory 700 may include an array 702 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 700 includes a command decoder 706 that may receive memory commands through a command bus 708 and provide (e.g., generate) corresponding control signals within the memory 700 to carry out various memory operations. For example, the command decoder 706 may respond to memory commands provided to the command bus 708 to perform various operations on the memory array 702. In particular, the command decoder 706 may be used to provide internal control signals to read data from and write data to the memory array 702. Row and column address signals may be provided (e.g., applied) to an address latch 710 in the memory 700 through an address bus 720. The address latch 710 may then provide (e.g., output) a separate column address and a separate row address.

The address latch 710 may provide row and column addresses to a row address decoder 722 and a column address decoder 728, respectively. The column address decoder 728 may select bit lines extending through the array 702 corresponding to respective column addresses. The row address decoder 722 may be connected to a word line driver 724 that activates respective rows of memory cells in the array 702 corresponding to received row addresses. The selected data line (e.g., a bit line or bit lines) corresponding to a received column address may be coupled to a read/write circuitry 730 to provide read data to an output data buffer 734 via an input-output data path 740. Write data may be provided to the memory array 702 through an input data buffer 744 and the memory array read/write circuitry 730.

The memory 700 may include a clock generator 716 that includes a delay circuit 714. The delay circuit 714 provides an output clock signal OUT 712 signal that may be used for clocking circuitry of the memory 700. The delay circuit 714 may include a phase mixer according to an embodiment of the invention. For example, the delay circuit 714 may include a phase mixer previously described with reference to any of FIGS. 1-4.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
   a first phase mixer stage configured to interpolate a first and a second input signal to provide a first intermediate signal and further configured to interpolate the second input signal and a third input signal to provide a second intermediate signal, the first phase mixer stage distorting duty cycle in providing the first intermediate signal; and
   a second phase mixer stage configured to interpolate the first intermediate signal and the second intermediate signal to provide an output signal and further configured to compensate for duty cycle distortion of the first phase mixer stage.

2. The apparatus of claim 1, wherein
   the first phase mixer stage comprises a first set of inverters;
   the second phase mixer stage comprises a second set of inverters; and
   an inverter in the second set of inverters is paired with an inverter in the first set of inverters.

3. The apparatus of claim 2, wherein the inverter in the second set of inverters that is paired with the inverter in the first set of inverters compensates for a duty cycle distortion provided by the inverter in the first set of inverters.

4. The apparatus of claim 1, further comprising:
   a mid-clock generation circuit configured to receive the first and third input signals and provide the second input signal.

9

5. The apparatus of claim 1, wherein the first phase mixer stage comprises:
a first phase mixer configured to interpolate the first and second input signals; and
a second phase mixer configured to interpolate the second and third input signals.

6. The apparatus of claim 5, wherein the first phase mixer comprises:
a first inverter configured to receive the first input signal and provide a first output signal at a first output; and
a second inverter configured to receive the second input signal and provide a second output signal at a second output, the second output coupled to the first output.

7. The apparatus of claim 1 wherein phase of the first input signal and the third input signal are phase shifted relative to one another.

8. The apparatus of claim 1 wherein the second input signal has a phase that is between a phase of the first input signal and a phase of the third input signal.

9. An apparatus comprising:
a first phase mixer configured to receive a first input signal and a second input signal, and further configured to provide a first intermediate signal;
a second phase mixer configured to receive the second input signal and a third input signal, and further configured to provide a second intermediate signal; and
a third phase mixer configured to receive the first intermediate signal and the second intermediate signal, and further configured to reverse duty cycle distortion in the first and second intermediate signals resulting from the first and second phase mixers to provide an output signal.

10. The apparatus of claim 9, wherein the first phase mixer is configured to interpolate the phase of the first input signal and the second input signal to provide the first intermediate signal.

11. The apparatus of claim 9, wherein the first, second, and third phase mixers each comprise a plurality of tri-state inverters.

12. The apparatus of claim 11, wherein each tri-state inverter in the third phase mixer substantially cancels a duty cycle distortion associated with a tri-state inverter in the first or second phase mixers.

13. The apparatus of claim 9, wherein a phase of the second input signal is between a phase of the first input signal and a phase of the third input signal.

14. The apparatus of claim 9, wherein the second input signal is provided by interpolating the phases of the first input signal and the third input signal.

15. The apparatus of claim 9 further comprising a second input signal generation circuit configured to receive the first and third input signals and further configured to provide the first, second, and third input signals.

16. A method comprising:
receiving a first input signal, a second input signal, and a third input signal;
interpolating the phases of the first input signal and the second input signal to provide a first intermediate signal;
interpolating the phases of the second input signal and the third input signal to provide a second intermediate signal; and
generating an output signal by phase interpolating the first intermediate signal and the second intermediate signal, the phase interpolating of the first and second intermediate signals compensating for duty cycle distortion caused by interpolating the phases of the first and second input signals and by interpolating the phases of the second and third input signals.

17. The method of claim 16, wherein the output signal has a duty cycle substantially equal to 50%.

18. The method of claim 16, wherein
the first intermediate signal and the second intermediate signal each has an associated duty cycle distortion; and
phase interpolating the first and second intermediate signals compensates for the associated duty cycle distortions.

19. The method of claim 16, wherein the second input signal is provided by phase mixing the first input signal and the second input signal.

20. The method of claim 16 further comprising:
receiving a control signal; and
generating at least one of the first intermediate signal, the second intermediate signal, and the output signal based, at least in part, on the control signal.

21. The method of claim 20, wherein each of the first intermediate signal, the second intermediate signal, and the output signal is based at least in part on the control signal.

22. An apparatus comprising:
first, second, and third clock nodes providing first, second, and third input clock signals respectively, the second input clock signal having a phase that is between a phase of the first input clock signal and the third input clock signal; and
a two-stage phase mixer circuit including, as a first stage of the two-stage, a first phase mixer comprising a plurality of first inverters each having first and second input nodes and a first output node, the first input nodes of the first inverters being coupled in common to the first clock node to receive the first input clock signal, the second input nodes of the first inverters being coupled in common to the second clock node to receive the second input clock signal, and the first output nodes of the first inverters being coupled in common to each other to provide an first output, and
the two-stage phase mixer circuit further including, as a first stage of the two-stage, a second phase mixer comprising a plurality of second inverters each having fourth and fifth input nodes and a second output node, the fourth input nodes of the second inverters being coupled in common to the second clock node to receive the second input clock signal, the fifth input nodes of the second inverters being coupled in common to the third clock node to receive the third input clock signal, and the second output nodes of the second inverters being coupled in common to each other to provide an second output.

23. The apparatus of claim 22, wherein the two-stage phase mixer circuit further includes, as a second stage of the two-stage, a third phase mixer comprising a plurality of third inverters each having seventh and eighth input nodes, the seventh input nodes of the third inverters being coupled in common to each other to receive the first output, and the eighth input nodes of the third inverters being coupled in common to each other to receive the second output.

24. The apparatus of claim 22, comprising:
a plurality of control nodes each providing control signals, each of the control signals being provided to corresponding ones of the first, second, and third inverters.

25. The apparatus of claim 1, wherein the first phase mixer and the second phase mixer stages are further configured to receive a control signal and to provide the first intermediate signal, the second intermediate signal, and the output signal based on the control signal.

* * * * *